(12) United States Patent
Kong et al.

(10) Patent No.: US 10,148,283 B2
(45) Date of Patent: Dec. 4, 2018

(54) DELTA-SIGMA MODULATOR

(71) Applicant: RESEARCH & BUSINESS FOUNDATION SUNGKYUNKWAN UNIVERSITY, Suwon-si (KR)

(72) Inventors: Bai Sun Kong, Seoul (KR); Moo Yeol Choi, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/784,642

(22) Filed: Oct. 16, 2017

(65) Prior Publication Data

US 2018/0109268 A1 Apr. 19, 2018

(30) Foreign Application Priority Data

Oct. 17, 2016 (KR) .................. 10-2016-0134650

(51) Int. Cl.
*H03M 3/00* (2006.01)
*H03H 17/02* (2006.01)

(52) U.S. Cl.
CPC ............ *H03M 3/436* (2013.01); *H03H 17/02* (2013.01); *H03M 3/422* (2013.01)

(58) Field of Classification Search
None
See application file for complete search history.

(56) References Cited

U.S. PATENT DOCUMENTS

| 5,420,892 A * | 5/1995 | Okamoto | H03M 3/44 341/143 |
| 7,042,377 B2 * | 5/2006 | Oliaei | H03M 3/344 341/143 |
| 7,852,249 B2 * | 12/2010 | Oliaei | H03M 3/37 341/143 |

OTHER PUBLICATIONS

Y. Geerts, et al., "A High-Performance Multibit ΔΣ CMOS ADC," *IEEE Journal of Solid-State Circuits*, vol. 35, No. 12, Dec. 2000, pp. 1829-1840.

(Continued)

*Primary Examiner* — Howard Williams
(74) *Attorney, Agent, or Firm* — NSIP Law

(57) ABSTRACT

A delta-sigma modulator includes a first integrator configured to integrate a sum of an input signal and a first feedback signal, a second integrator configured to integrate a sum of an output value of the first integrator and a second feedback signal, a first FIR filter circuit configured to perform a first FIR filtering on an output modulation signal and a delay modulation signal and feeds back the signals to stage prior to the first integrator, and a second FIR filter circuit configured to perform a second FIR filtering on the output modulation signal and the delay modulation signal and feeds back the signals to a stage prior to the second integrator.

13 Claims, 5 Drawing Sheets

(56) References Cited

OTHER PUBLICATIONS

P. Rombouts, et al., "An Approach to Tackle Quantization Noise Folding in Double-Sampling ΣΔ Modulation A/D Converters," *Proceedings of the IEEE Transactions on Circuits and Systems—II: Analog and Digital Signal Processing*, vol. 50, No. 4, Apr. 2003, pp. 157-163.

J. Koh, et al., "A 66dB DR 1.2V 1.2mW Single-Amplifier Double-Sampling $2^{nd}$-order ΔΣ ADC for WCDMA in 90nm CMOS," *Proceedings of the ISSCC, Session 9, Switched-Capacitor ΔΣ Modulators*, Salon 7, Feb. 8, 2005, pp. 170-171 (3 pages, in English).

Z. Yang, et al., "A 0.5-V 35-μW 85-dB DR Double-Sampled ΔΣ Modulator for Audio Applications," *IEEE Journal of Solid-State Circuits*, vol. 47, No. 3, Mar. 2012, pp. 722-735.

\* cited by examiner

DELTA-SIGMA MODULATOR

CROSS-REFERENCE TO RELATED APPLICATION(S)

This application claims the benefit under 35 USC § 119(a) of Korean Patent Application No. 10-2016-0134650 filed on Oct. 17, 2016, in the Korean Intellectual Property Office, the entire disclosure of which is incorporated herein by reference for all purposes.

BACKGROUND

1. Field

The present disclosure relates to a delta-sigma modulator.

2. Description of Related Art

Discrete-time (DT) delta-sigma modulators (hereinafter abbreviated as "DSM") are widely used in high resolution audio and middle-low speed radio receiver applications due to features such as insensitivity to a clock jitter, accurate filter coefficient, a scalability of a clock frequency, as compared with a continuous-time DSM. In the DT DSM using a switched capacitor integrator (hereinafter, referred to as an SC integrator), a double sampling technique for effectively doubling an oversampling ratio (hereinafter, abbreviated as OSR) without being bound to OP amp settling requirement has been used.

Despite the advantage of the doubled OSR, the double-sampled DSM has a problem of noise folding due to a mismatch between the feedback digital-analog converter (DAC) paths.

As one method for avoiding the noise folding, a method which uses a single capacitor in two feedback paths has been suggested. When this method is used, the mismatch problem does not occur.

However, the method has a disadvantage in that it cannot allow a configuration in which the sampling capacitor is shared by input and feedback DAC signals. Such a restriction causes a silicon area to be increased because of increased kT/C noise, higher bias current of the OP-amp, the doubled sampling, and integrated capacitors.

As another method for avoiding the problems of noise folding, there is a method that uses a modified noise transfer function (NTF) technique. In the modified noise transfer technique, zero is added to reduce a shaped quantization noise near fs/2. Such a technique may minimize a noise folding amount and adopt input-sampling sharing structure so that it is possible to achieve the reduced kT/C noise, a lower OP-amp bias current, and a smaller silicon area.

However, (1+z−1) of the NTF may deteriorate a signal-to-quantization noise ratio (SQNR) by 6 dB per zero and a complex double sampled resonator for implementing zero at fs/2 causes higher overheads in terms of power and silicon area used.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a delta-sigma modulator includes a first integrator configured to integrate a sum of an input signal and a first feedback signal, a second integrator configured to integrate a sum of an output value of the first integrator and a second feedback signal, a first FIR filter circuit configured to perform a first FIR filtering on an output modulation signal and a delay modulation signal and feeds back the signals to stage prior to the first integrator, and a second FIR filter circuit configured to perform a second FIR filtering on the output modulation signal and the delay modulation signal and feeds back the signals to a stage prior to the second integrator.

The delta-sigma modulator according may further include a first adder located at a stage prior to the first integrator and configured to add the input signal and the first feedback signal and a first fe0edback signal generating circuit configured to receive the output value of the first FIR filter circuit and generate the first feedback signal through a processing path selected according to a first switching signal or a second switching signal.

The delta-sigma modulator may further include a second adder located at a stage prior to the second integrator and configured to add an output value of the first integrator and the second feedback signal and a second feedback signal generating circuit configured to receive the output value of the second FIR filter circuit and generate the second feedback signal through a processing path selected according to the first switching signal or the second switching signal.

The first FIR filter circuit may further include a first FIR tap configured to weight a first FIR coefficient to the output modulation signal, a second FIR tap configured to weight a second FIR coefficient to the delay modulation signal, and a third adder configured to add and output output values of the first FIR tap and the second FIR tap.

The second FIR filter circuit may include a third FIR tap configured to weight a third FIR coefficient to the output modulation signal, a fourth FIR tap configured to weight a fourth FIR coefficient to the delay modulation signal, and a fourth adder configured to add and output output values of the third FIR tap and the fourth FIR tap.

The first feedback signal generating circuit may further include a first switch configured to conduct an output signal of the first FIR filter circuit according to the first switching signal, a second switch configured to conduct the output signal of the first FIR filter circuit according to the second switching signal, a first feedback tap configured to weight a first feedback coefficient to an output value of the first switch and output the weighted output value of the first switch to the first adder, and a second feedback tap configured to weight a first feedback coefficient to an output value of the second switch and output the weighted output value of the second switch to the first adder.

The second feedback signal generating circuit may further include a third switch configured to conduct an output signal of the second FIR filter circuit according to the first switching signal, a fourth switch configure to conduct the output signal of the second FIR filter circuit according to the second switching signal, a third feedback tap configured to weight a second feedback coefficient to an output value of the third switch and output the weighted output value of the third switch to the second adder, and a fourth feedback tap configured to weight the second feedback coefficient to an output value of the fourth switch and output the weighted output value of the fourth switch to the second adder.

The delta-sigma modulator may further include a fifth adder configured to add an output value of the second integrator and a third feedback signal, a third integrator configured to integrate an output value of the fifth adder, and a third feedback signal generating circuit configured to receive the output modulation signal and generate the third feedback signal through a processing path selected according to the first switching signal or the second switching signal.

The third feedback signal generating circuit may include a fifth switch configured to conduct the output modulation signal according to the first switching signal, a sixth switch configured to conduct the output modulation signal according to the second switching signal, a fifth feedback tap configured to weight a third feedback coefficient to an output value of the fifth switch and output the weighted output value of the fifth switch to the fifth adder, and a sixth feedback tap configured to weight the third feedback coefficient to an output value of the sixth switch and output the weighted output value of the sixth switch to the fifth adder.

The delta-sigma modulator may further include a slicer configured to quantize an output value of the third integrator and output the quantized output modulation signal.

The delta-sigma modulator may further include a delay unit configured to generate the delay modulation signal by delaying the output modulation signal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
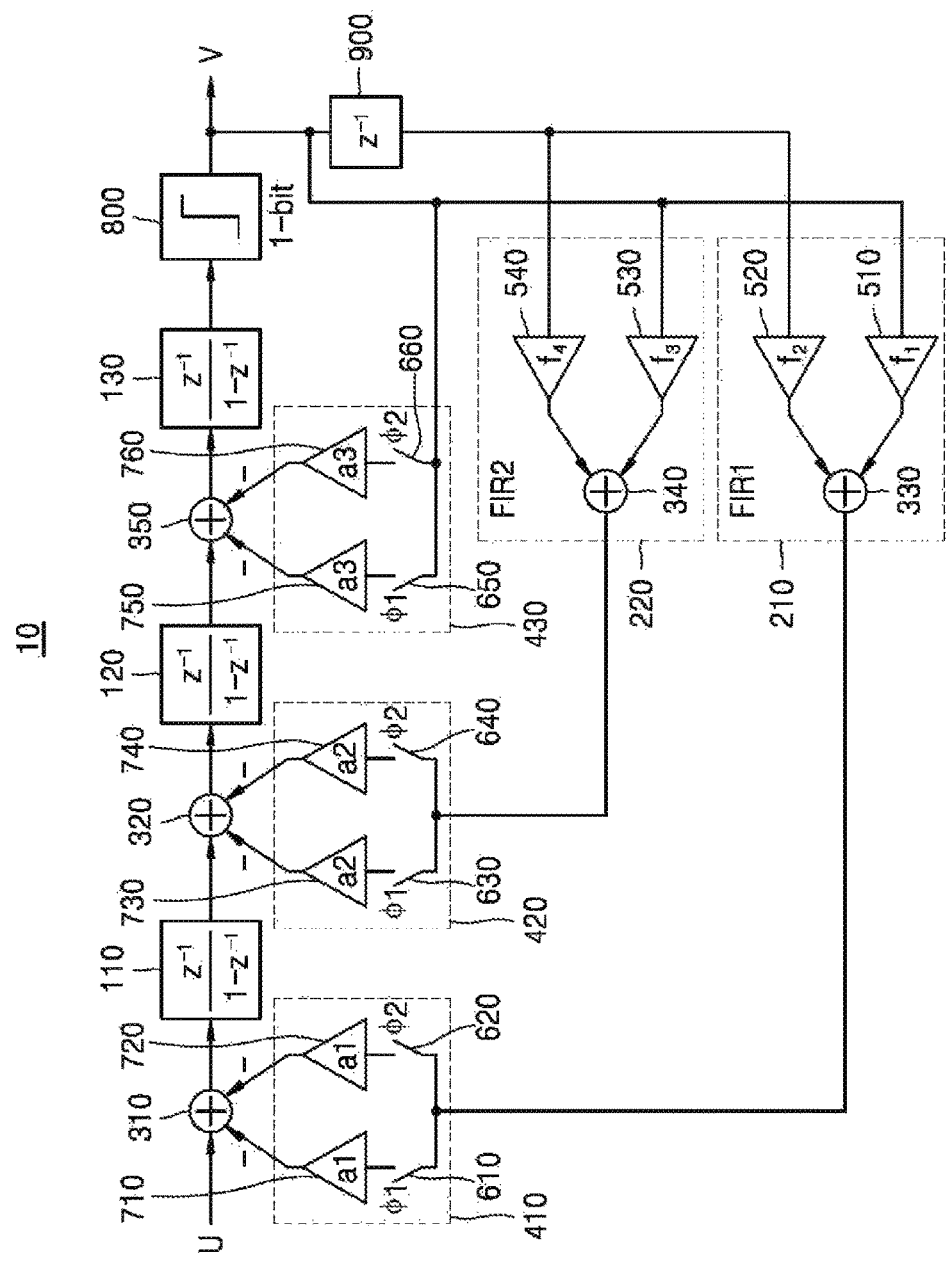
FIG. 1 is a diagram illustrating an example of a delta-sigma modulator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating an example of a delta-sigma modulator.

Referring to FIG. 1, a delta-sigma modulator 10 includes a first integrator 110, a second integrator 120, a first FIR filter circuit 210, and a second FIR filter circuit 220. In FIG. 1, the delta-sigma modulator 10 includes a first adder 310, a second adder 320, a first feedback signal generating circuit 410, a second feedback signal generating circuit 420, a fifth adder 350, a third integrator 130, a third feedback signal generating circuit 430, a slicer 800, and a delay unit 900, however, these elements may be omitted or replaced, as necessary.

The first adder 310 is located at a stage prior to the first integrator 110 and adds an input signal U and a first feedback signal. The first integrator 110 may integrate a sum of the input signal U and the first feedback signal.

The second adder 320 is located at a stage prior to the second integrator 120 and adds an output value of the first integrator 110 and a second feedback signal. The second integrator 120 may integrate a sum of the output value of the first integrator 110 and the second feedback signal.

The first FIR filter circuit 210 performs a first FIR filtering on an output modulation signal V and a delay modulation signal and feeds back the signals to the stage previous to the first integrator 110. The delay modulation signal may be generated by delaying the output modulation signal V by a delaying unit 900 which will be described below.

The first FIR filter circuit 210 includes a first FIR tap 510, a second FIR tap 520, and a third adder 330. The first FIR tap 510 weights a first FIR coefficient $f_1$ to the output modulation signal V and the second FIR tap 520 weights a second FIR coefficient $f_2$ to the delay modulation signal. The third adder 330 adds output values of the first FIR tap 510 and the second FIR tap 520 and outputs the result of the adding. "Weighting of a coefficient" refers to "mathematically multiplying of the coefficient and the input signal."

The second FIR filter circuit 220 performs a second FIR filtering process on the output modulation signal V and the delay modulation signal to feedback the signals to the stage previous to the second integrator 120.

The second FIR filter circuit 220 includes a third FIR tab 530, a fourth FIR tab 540, and a fourth adder 340. The third FIR tap 530 weights a third FIR coefficient $f_3$ to the output modulation signal V and the fourth FIR tap 540 weights a fourth FIR coefficient $f_4$ to the delay modulation signal. The fourth adder 340 may add output values of the third FIR tap 530 and the fourth FIR tap 540 and output the result of the adding.

The first feedback signal generating circuit 410 receives an output value of the first FIR filter circuit 210 to generate a first feedback signal through a processing path selected according to a first switching signal ϕ1 and a second switching signal ϕ2.

The first feedback signal generating circuit 410 includes a first switch 610, a second switch 620, a first feedback tap 710, and a second feedback tap 720.

The first switch 610 may conduct the output signal of the first FIR filter circuit 210 according to the first switching signal ϕ1 and the second switch 620 may conduct the output signal of the first FIR filter circuit 210 according to the second switching signal ϕ2.

The first feedback tap 710 weights a first feedback coefficient a1 to the output value of the first switch 610 and outputs the weighted value to the first adder 310. The second feedback tap 720 weights the first feedback coefficient a1 to the output value of the second switch 620 and outputs the weighted value to the first adder 310.

The second feedback signal generating circuit 420 receives an output value of the second FIR filter circuit 220 to generate a second feedback signal through a processing path selected according to the first switching signal ϕ1 and the second switching signal ϕ2.

The second feedback signal generating circuit 420 includes a third switch 630, a fourth switch 640, a third feedback tap 730, and a fourth feedback tap 740.

The third switch 630 conducts the output signal of the second FIR filter circuit 210 according to the first switching signal ϕ1. The fourth switch 640 conducts the output signal of the second FIR filter circuit 210 according to the second switching signal ϕ2.

The third feedback tap 730 weights a second feedback coefficient a2 to the output value of the third switch 630 and outputs the weighted value to the second adder 320 and the fourth feedback tap 740 weights the second feedback coefficient a2 to the output value of the fourth switch 640 and outputs the weighted value to the second adder 320.

The fifth adder 350 adds the output value of the second integrator 120 and the third feedback signal. The third integrator integrates an output value of the fifth adder 350.

The third feedback signal generating circuit 430 may receive an output modulation signal V and generate a third feedback signal through a processing path selected according to the first switching signal ϕ1 or the second switching signal ϕ2.

The third feedback signal generating circuit 430 may include a fifth switch 650, a sixth switch 660, a fifth feedback tap 750, and a sixth feedback tap 760.

The fifth switch 650 conducts the output modulation signal V according to the first switching signal ϕ1 and the sixth switch conducts the output modulation signal V according to the second switching signal ϕ2.

The fifth feedback tap 750 weights a third feedback coefficient a3 to an output value of the fifth switch 650 and outputs the weighted value to the fifth adder 350. The sixth feedback tap 760 weights the third feedback coefficient a3 to an output value of the sixth switch 660 and outputs the weighted value to the fifth adder 350.

The slicer 800 quantizes the output value of the third integrator 130 and outputs the quantized output modulation signal V. Thus, a one-bit quantizer may be used as the slicer 800.

The delay unit 900 may delay the output modulation signal V to generate a delay modulation signal. The delay unit 900 may be configured to delay the output modulation signal V by, for example, one cycle.

The delta-sigma modulator 10 illustrated in FIG. 1 is a double sampled delta-sigma modulator having FIR feedback DACs. The exemplary delta-sigma modulator 10 has a third-order cascaded integrator feedback architecture and includes two dual-tap FIR filters in the feedback path.

The deterioration of the performance of a conventional double-sampled delta-sigma modulator may be caused by a single tone at fs/2 due to the mismatch between the feedback paths and noise folding generated by the frequency modulation between shaped quantization noises.

In order to suppress the noise folding, the delta-sigma modulator 10 shown in FIG. 1 includes the first FIR filter circuit 210 having two taps in the feedback path directed to the first integrator 110. The first FIR filter circuit 210 is designed to have zero at fs/2 so that the shaped quantization noise near fs/2 may be attenuated. However, there is a new pole in a transfer function, which causes the change in the NTF and deteriorates the noise shaping.

Accordingly, in order to restore an original NTF, the delta-sigma modulator 10 shown in FIG. 1 includes a second FIR filter circuit 220 having two taps in the feedback path directed to the second integrator 120.

In order to perform an operation intended by the delta-sigma modulator 10 loop coefficients are be set as prescribed in Equation 1 below.

$$a_1 = a_2 = 1, f_1 = f_2 = f_4 = \frac{a_{1p}}{2}, f_3 = a_{2p}, a_3 = a_{3p} \quad \text{[Equation 1]}$$

In this case, $a_{1p}$ refers to a first integrator feedback coefficient in a third-order prototype DSM which does not have FIR feedback. $a_{2p}$ and $a_{3p}$ refer corresponding second and third integrator feedback coefficients, respectively.

During an inducing process, in order to make a polynomial degree of a denominator of the transfer function a third order, a second FIR coefficient f2 and a fourth FIR coefficient f4 of the delayed signal for both FIR filter circuits are set to be equal.

The first FIR coefficient f1 and the second FIR coefficient f2 are set to be the same to add zero to fs/2 and maximize attenuation at the frequency.

By setting the coefficients as described above, the noise components near fs/2 of the feedback DAC output for the first integrator 110 are suppressed and the NTF is maintained to be the same as the prototype DSM to which the FIR feedback is not applied.

Figure 2:
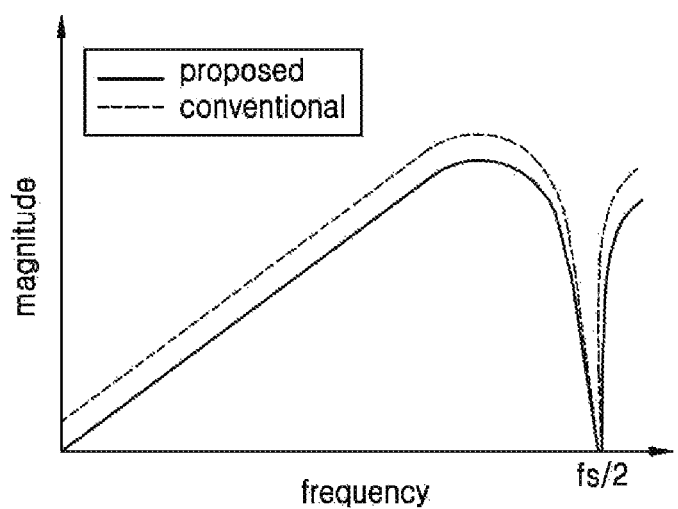
FIG. 2 is a graph illustrating an example of a frequency response of a feedback DAC of a delta-sigma modulator.
Figure 3:
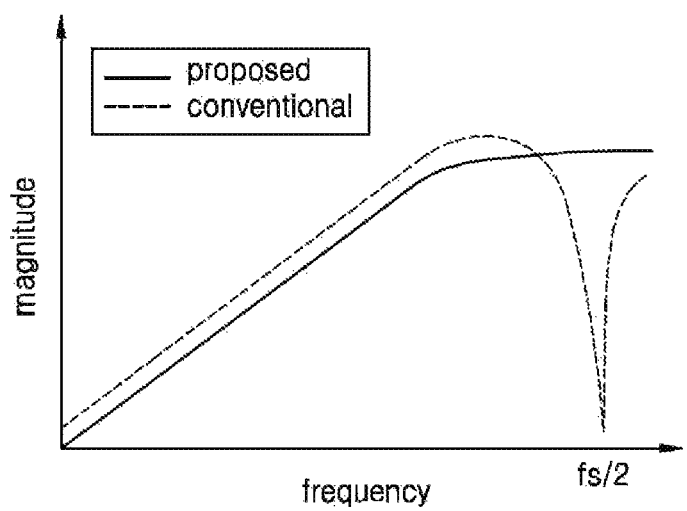
FIG. 3 is a graph illustrating an example of a frequency response of an NTF of a delta-sigma modulator.

FIG. 2 is a graph illustrating a frequency response of a feedback DAC of a delta-sigma modulator. FIG. 3 is a graph illustrating a frequency response of an NTF of a delta-sigma modulator.

As opposed to conventional modulators, the delta-sigma modulator 10 shown in FIG. 1 does not need to share the capacitor between two feedback paths to avoid the noise folding. The capacitor sharing input and feedback DAC paths may be allowed, and thus a lower kT/C noise may be achieved. Reduction of the kT/C noise permits small-size sampling and usage of integrated capacitors, which results in a lower power consumption and a reduced silicon area due to relaxation of the OP-amp design condition.

Even when compared to a conventional modulator design in which the modified NTF technique is applied, the delta-sigma modulator 10 shown in FIG. 1 does not cause the lowering of an SQNR.

Referring to FIG. 2, in both cases, there is a zero at fs/2 in the frequency response of the feedback DAC for the first integrator, which suppresses the noise near the corresponding frequency.

Referring to FIG. 3, in the conventional modulator, zero is achieved by modifying the NTF to have zero at fs/2, which causes increased in-band noise (6 dB per zero). In contrast, the delta-sigma modulator 10 as shown in FIG. 1 applies the FIR to achieve zero. Therefore, the NTF does not have such a zero value, which corresponds to the in-band noise not exhibiting an increase.

Figure 4:
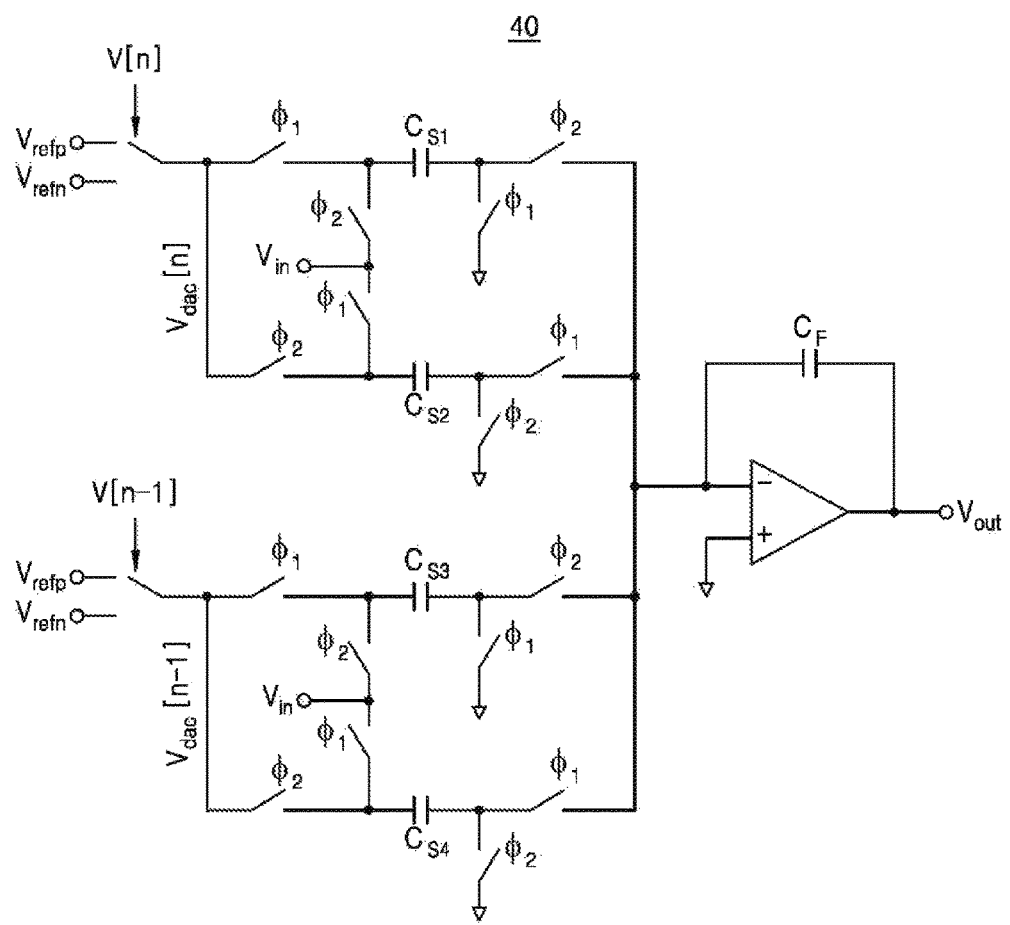
FIG. 4 is a diagram illustrating an example of circuit configuration of an FIR filter circuit, a feedback signal generating circuit, an adder, and an integrator.

FIG. 4 is a diagram illustrating an exemplary circuit configuration of an FIR filter circuit, a feedback signal generating circuit, an adder, and an integrator.

The diagram shown in FIG. 4 is based on an input capacitor sharing structure. That is, the integrator structure has two sampling capacitors $C_{S1}$, $C_{S2}$, $C_{S3}$, and $C_{S4}$ for each double sampling path.

A signal path through the sampling capacitors $C_{S1}$, and $C_{S2}$ performs shared double sampling between the input signal $V_{in}$ and a current FIR feedback DAC signal V[n]. In contrast, a signal path through the sampling capacitors $C_{S3}$ and $C_{S4}$ performs another shared double sampling between the input signal $V_{in}$ and a one-cycle delayed FIR feedback DAC signal V[n-1].

In this configuration, when the mismatch of the capacitors is considered and $V_{in}$ is assumed as 0, an output of the SC integrator of FIG. 4 may be deducted as in Equation 2 below.

$$V_{out}[n] = V_{out}[n-1] + \frac{\overline{C_{S12}}}{C_I} \cdot V_{dac}[n] + \frac{\overline{C_{S34}}}{C_I} \cdot V_{dac}[n-1] + \quad \text{[Equation 2]}$$

$$\frac{(-1)^n \cdot \Delta C_{S12}}{2C_I} \cdot V_{dac}[n] + \frac{(-1)^n \cdot \Delta C_{S34}}{2C_I} \cdot V_{dac}[n-1]$$

$$\text{where } \overline{C_{S12}} = (C_{S1} + C_{S12})/2, \overline{C_{S34}} = (C_{S3} + C_{S4})/2,$$

$$\Delta C_{S12} = C_{S1} - C_{S2}, \Delta C_{S34} = C_{S3} - C_{S4}$$

In Equation 2, last two terms show that the feedback signal $V_{dac}[n]$ or $V_{dac}[n-1]$ is intermodulated by an associated single tone due to capacitive mismatch $\Delta C_{S12}$ or $\Delta C_{S34}$.

The delta-sigma modulator 10 illustrated in FIG. 1 has a condition in which the capacitive mismatches $\Delta C_{S12}$ and $\Delta C_{S34}$ are equal to each other. If the capacitive mismatches $\Delta C_{S12}$ and $\Delta C_{S34}$ are not equal to each other, zero added by the FIR is not located at fs/2.

Figure 5:
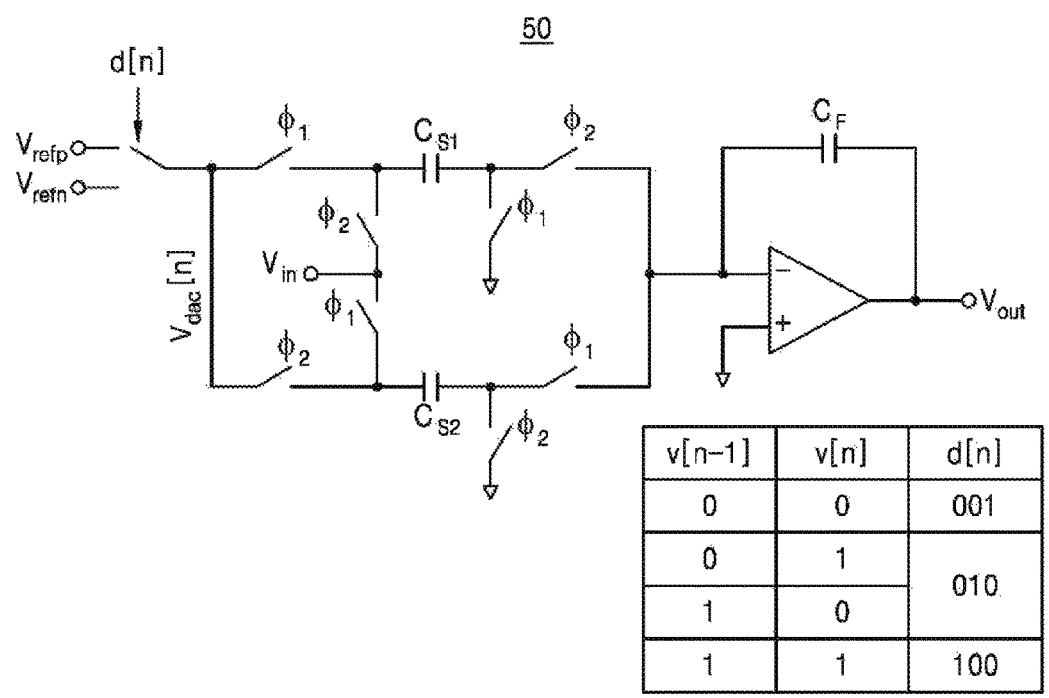
FIG. 5 is a diagram illustrating an example of a circuit configuration of an FIR filter circuit, a feedback signal generating circuit, an adder, and an integrator.

The following circuit configuration shown FIG. 5 may solve the above-mentioned problem.

FIG. 5 is a diagram illustrating an example of a circuit configuration of an FIR filter circuit, a feedback signal generating circuit, an adder, and an integrator.

A circuit 50 of FIG. 5 is used for an integrated circuit configuration of the first FIR filter circuit 210, the first feedback signal generating circuit 410, the first adder 310, and the first integrator 110. Thus, the circuit 50 of FIG. 5 may be referred to as a double-sampled SC integrator having 1.5 bit FIR feedback DAC.

According to FIG. 5, the delta-sigma modulator 10 includes 1.5 bit FIR feedback DAC. The 1.5 bit FIR feedback DAC includes one single sampling capacitor $C_{S1}$, or $C_{S2}$ for each double sampling path.

In each signal path which passes through the sampling capacitor $C_{S1}$, or $C_{S2}$, the shared double sampling between the input signal $V_{in}$ and the 1.5 bit FIR feedback DAC signal d[n] is implemented.

As illustrated in table of FIG. 5, the signal d[n] represents three statuses by two bits so that the signal may be referred to as a 1.5 bit signal. The output of the slicer 800 for current and previous sample times may be encoded to be a three bit signal d[n] such that each signal path selects one of three reference voltages.

When compared to the circuit illustrated in FIG. 4, the circuit illustrated in FIG. 5 is more compact and the noise folding is effectively avoided.

The output of the SC integrator shown in FIG. 5 will be deducted as in Equation 3 below.

$$V_{out}[n] = V_{out}[n-1] + \frac{\overline{C_S}}{C_I} \cdot \{V_{dac}[n] + V_{dac}[n-1]\} + \quad \text{[Equation 3]}$$

$$\frac{(-1)^n \cdot \Delta C_S}{2C_I} \cdot \{V_{dac}[n] + V_{dac}[n-1]\}$$

$$\text{where } \overline{C_S} = (C_{S1} + C_{S2})/2, \Delta C_S = C_{S1} - C_{S2}$$

Differently from FIG. 4, last two terms of Equation 2 are combined and zero added by the FIR is precisely located at fs/2. Therefore, the noise folding problem of the double sampled DSM may be effectively mitigated by the circuit shown in FIG. 5.

Figure 6:
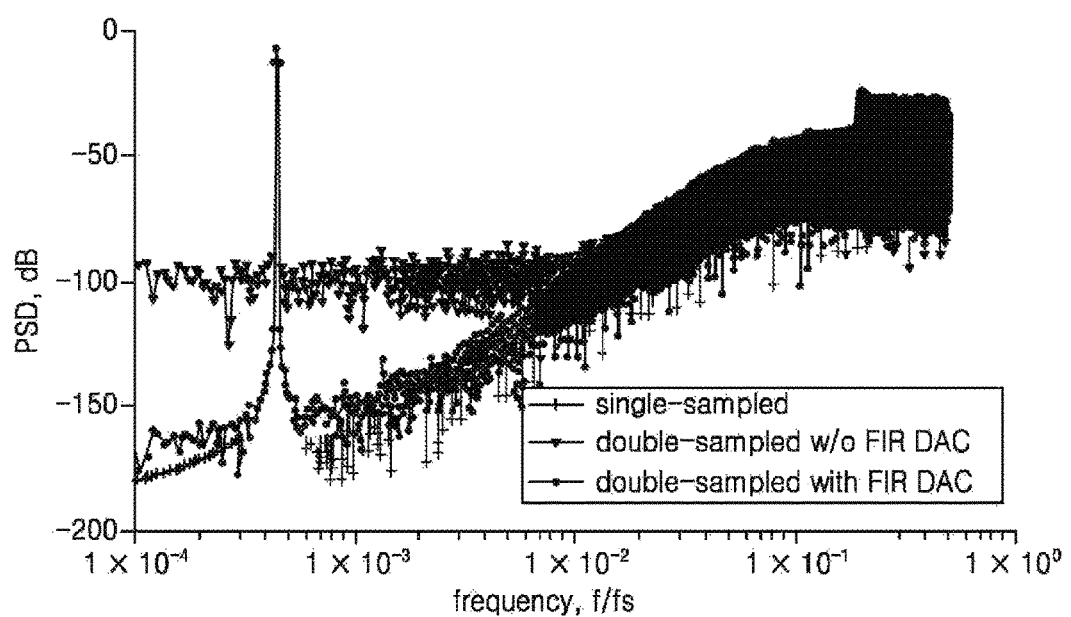
FIG. 6 is a graph comparing a performance of an example of a delta-sigma modulator with a typical delta-sigma modulator.

FIG. 6 is a diagram comparing a performance of a delta-sigma modulator described above with a conventional delta-sigma modulator.

According to the examples described above, delta-sigma modulator 10 has 128 OSR and is simulated through SIMULINK to have 0.5% of mismatch between feedback paths. FIG. 6 illustrates a simulated power spectral density (PSD) of the conventional double-sampled DSM and that of the double-sampled DSMs described above. A simulated PSD of the single-sampled DSM is also included for reference.

An SQNR of the single-sampled DSM is 102.7 dB and an SQNR of the double-sampled DSM of the conventional circuit is 64.3 dB due to noise folding.

An SQNR of the delta-sigma modulator 10 according to the examples described above is 101.5 dB which shows a performance improvement of 37 dB. This is similar to the performance of the single-sampled DSM.

Further, through a circuit-level evaluation, it is confirmed that the delta-sigma modulator 10 described above uses 30% lower power consumption and 20% reduced area as compared with examples in the conventional art. This is caused by the reduced capacitor size and the relaxing of an OP-amp settling condition.

Thus, a technical object achieved is providing a delta-sigma modulator which effectively mitigates the noise folding problem.

The above-referred drawings and the detailed description of the present disclosure are provided for illustrative purposes only but not intended to limit the scope of the present disclosure described in the appending claims. Therefore, it will be appreciated to those skilled in the art that various modifications are made and other equivalent embodiments are available. Accordingly, the actual scope of the present invention must be determined by the spirit of the appended claims.

What is claimed is:

1. A delta-sigma modulator, comprising:
   a first integrator configured to integrate a sum of an input signal and a first feedback signal;
   a second integrator configured to integrate a sum of an output value of the first integrator and a second feedback signal;
   a first FIR filter circuit configured to filter signals comprising an output modulation signal and a delay modulation signal, and feed back the signals to a stage prior to the first integrator; and
   a second FIR filter circuit configured to filter the signals, and feed back the signals to a stage prior to the second integrator; and
   a first feedback signal generating circuit configured to receive an output value of the first FIR filter circuit, and generate the first feedback signal by processing the output value of the first FIR filter circuit according to a first switching signal or a second switching signal.

2. The delta-sigma modulator according to claim 1, further comprising:
   a first adder located at a stage prior to the first integrator and configured to add the input signal and the first feedback signal.

3. The delta-sigma modulator according to claim 2, further comprising:
   a second adder located at a stage prior to the second integrator, and configured to add the output value of the first integrator and the second feedback signal; and
   a second feedback signal generating circuit configured to receive the output value of the second FIR filter circuit, and generate the second feedback signal through a processing path selected according to the first switching signal or the second switching signal.

4. The delta-sigma modulator according to claim 3, wherein the first FIR filter circuit comprises:
   a first FIR tap configured to weight a first FIR coefficient to the output modulation signal;
   a second FIR tap configured to weight a second FIR coefficient to the delay modulation signal; and
   a third adder configured to add and output output values of the first FIR tap and the second FIR tap.

5. The delta-sigma modulator according to claim 4, wherein the second FIR filter circuit comprises:
   a third FIR tap configured to weight a third FIR coefficient to the output modulation signal;
   a fourth FIR tap configured to weight a fourth FIR coefficient to the delay modulation signal; and
   a fourth adder configured to add and output output values of the third FIR tap and the fourth FIR tap.

6. The delta-sigma modulator according to claim 5, wherein the first feedback signal generating circuit comprises:

a first switch configured to conduct an output signal of the first FIR filter circuit according to the first switching signal;
   a second switch configured to conduct the output signal of the first FIR filter circuit according to the second switching signal;
   a first feedback tap configured to weight a first feedback coefficient to an output value of the first switch, and output the weighted output value of the first switch to the first adder; and
   a second feedback tap configured to weight a first feedback coefficient to an output value of the second switch, and output the weighted output value of the second switch to the first adder.

7. The delta-sigma modulator according to claim 6, wherein the second feedback signal generating circuit comprises:
   a third switch configured to conduct an output signal of the second FIR filter circuit according to the first switching signal;
   a fourth switch configure to conduct the output signal of the second FIR filter circuit according to the second switching signal;
   a third feedback tap configured to weight a second feedback coefficient to an output value of the third switch, and output the weighted output value of the third switch to the second adder; and
   a fourth feedback tap configured to weight the second feedback coefficient to an output value of the fourth switch, and output the weighted output value of the fourth switch to the second adder.

8. The delta-sigma modulator according to claim 7, further comprising:
   a fifth adder configured to add an output value of the second integrator and a third feedback signal;
   a third integrator configured to integrate an output value of the fifth adder; and
   a third feedback signal generating circuit configured to receive the output modulation signal, and generate the third feedback signal through a processing path selected according to the first switching signal or the second switching signal.

9. The delta-sigma modulator according to claim 8, wherein the third feedback signal generating circuit comprises:
   a fifth switch configured to conduct the output modulation signal according to the first switching signal;
   a sixth switch configured to conduct the output modulation signal according to the second switching signal;
   a fifth feedback tap configured to weight a third feedback coefficient to an output value of the fifth switch, and output the weighted output value of the fifth switch to the fifth adder; and
   a sixth feedback tap configured to weight the third feedback coefficient to an output value of the sixth switch, and output the weighted output value of the sixth switch to the fifth adder.

10. The delta-sigma modulator according to claim 9, further comprising:
    a slicer configured to quantize an output value of the third integrator, and output the quantized output modulation signal.

11. The delta-sigma modulator according to claim 10, further comprising:
    a delay unit configured to generate the delay modulation signal by delaying the output modulation signal.

12. A delta-sigma modulator, comprising:

a first integrator configured to integrate a sum of an input signal and a first feedback signal;

a second integrator configured to integrate a sum of an output value of the first integrator and a second feedback signal;

a first FIR filter circuit configured to filter signals comprising an output modulation signal and a delay modulation signal, and feed back the signals to a stage prior to the first integrator;

a second FIR filter circuit configured to filter the signals, and feed back the signals to a stage prior to the second integrator; and a feedback signal generating circuit comprising a feedback tap configured to weight a feedback coefficient to an output value of a switch, and output the weighted output value of the switch to a first adder.

13. A delta-sigma modulator, comprising:

a first integrator configured to integrate a sum of an input signal and a first feedback signal;

a second integrator configured to integrate a sum of an output value of the first integrator and a second feedback signal;

a first FIR filter circuit configured to filter signals comprising an output modulation signal and a delay modulation signal, and feed back the signals to a stage prior to the first integrator;

a second FIR filter circuit configured to filter the signals, and feed back the signals to a stage prior to the second integrator; and a feedback signal generating circuit configured to generate the first feedback signal by processing an output value of the first FIR filter circuit according to a first switching signal or a second switching signal, wherein the first FIR filter circuit comprises a first FIR tap configured to weight a first FIR coefficient to the output modulation signal, a second FIR tap configured to weight a second FIR coefficient to the delay modulation signal, and an adder configured to add the output values of the first FIR tap and the second FIR tap.

* * * * *